United States Patent [19]

Preuss

[11] 4,001,669
[45] Jan. 4, 1977

[54] COMPENSATING BRIDGE CIRCUIT
[75] Inventor: Arnfried Preuss, Bordesholm, Germany
[73] Assignee: Howaldsverke-Deutsche Werft Aktiengesellschaft Hamburg und Kiel, Kiel, Germany
[22] Filed: Feb. 21, 1975
[21] Appl. No.: 551,942
[30] Foreign Application Priority Data
  Mar. 1, 1974 Germany .......................... 2409840
[52] U.S. Cl. ............................ 323/75 C; 323/75 N
[51] Int. Cl.² ........................................ G01R 17/10
[58] Field of Search ........................ 323/75 C, 75 N
[56] References Cited
  UNITED STATES PATENTS
  2,980,852  4/1961  Mell ................................. 323/75 C

*Primary Examiner*—A. D. Pellinen
*Attorney, Agent, or Firm*—Lowe, King, Price & Markva

[57] ABSTRACT

A compensating bridge circuit is used for measuring physical quantities directly. The circuit comprises an unbalanced Wheatstone bridge having a quantity-dependent voltage at an output thereof. An ohmic potential divider circuit produces a divisional voltage for compensating the quantity-dependent voltage. The divider circuit includes two resistances one of which is variable. An input voltage is fed to the Wheatstone bridge and a supply voltage is provided to the potential divider circuit. The supply voltage is composed of the bridge input voltage and the divisional voltage whereby, when the circuit system is balanced, the relationship between an input quantity $x$ and a balancing quantity $y$ is linear.

15 Claims, 6 Drawing Figures

COMPENSATING BRIDGE CIRCUIT

BACKGROUND OF THE INVENTION

The invention relates to compensating bridge circuits, particularly to bridge circuits used for measuring mechanical quantities.

When mechanical quantities are measured by electrical means, the measured quantity is converted by a transducer to a corresponding electrical quantity. Transducers are functionally usually based on the change in the value of a resistance, an inductance, or a capacitance, resulting from a displacement caused by the measured quantity. Since such displacements are mostly very small, the resultant change in magnitude of the electrical output quantity is generally also small. This applies for instance to the measurement of mechanical quantities by strain gauges in which the changes in resistance that require detection and measurement are in the order of $10^{-4}$ to about $10^{-8}$. Apart from a few special cases, the required measurement is mostly performed by causing the change in the electrical quantity to affect the balance of a Wheatstone bridge and by either indicating the output voltage of the unbalanced bridge by a pointer on a scale (deflection method) or rebalancing the bridge by adjustment of a resistor (null method). Whereas the deflection method is preferred for solving the majority of measuring problems since the apparatus requirement is low, the null method is better for effecting very precise measurements because it eliminates the effect of fluctuations in the supply voltage and generally contains fewer parameters which affect the degree of precision.

Many different kinds of compensating circuits for measuring physical quantities are known. One such circuit is shown in FIG. 1. A voltage $V_b$ obtained from an input bridge A comprising strain gauges S is compensated by the output voltage $V_{bb}$ of a second balancing bridge B containing a measuring potentiometer Mp. In this compensating circuit it is a drawback that even the slightest drift in the value of the resistors R in the balancing bridge may falsely indicate that the input bridge is out of balance, thus adversely affecting the precision of the measurement in a manner that is particularly objectionable in cases in which the magnitude of a measured quantity is to be observed for a longer period in relation to a previously fixed reference value. Another drawback arises when the measured quantity is required not in terms of the degree of imbalance of the bridge but as an absolute value. In such a case, the measuring potentiometer would have to be provided with a scale of its own depending upon the type of the input transducers and the measuring range. Naturally this would cause major complications.

Another known circuit arrangement is that shown in FIG. 2. Here the balancing bridge is fed with a voltage reduced by a potential divider $R_{d1}$, $R_{d2}$, $R_{d3}$. This leads to better null stability and at the same time the scale division of the measuring potentiometer Mp can be calibrated by varying a resistor $R_{d1}$ in the potential divider. The somewhat large number of precision components in this arrangement is an undesirable feature. This applies more specifically when balancing is to be effected digitally with the aid of a stepped resistor network in which the resistors are attributed values according to a predetermined scheme. It will be appreciated that a linear potentiometer circuit contains twice as many components as a variable liner resistor.

Yet another compensating circuit is diagrammatically shown in FIG. 3. Here the potential divider has been replaced by a variable resistor $R_k$. The circuit relies on a high ohmic differential amplifier with the gain g amplifies the input voltage $V_b$. When the voltage $g \cdot V_b$ will be compensated, the voltage across the null type indicator will be zero and the current $i_m$ flowing through the measuring resistor $R_m$ will be $$i_m = \frac{g \cdot V_b}{R_m}$$

On the other hand, the relationship $$i_m = \frac{V_k}{R_k}$$

holds for the compensating branch to which the supply voltage $U_s$ is applied.

It follows that $$\frac{g \cdot V_b}{R_m} = \frac{V_k}{R_k} \text{ or that}$$

$$V_b = \frac{V_k \cdot R_m}{g \cdot R_k} = \text{const.} \cdot G_k$$

The reading of the measured quantity therefore depends linearly upon the conductance $G_k$ of the balancing resistor $R_k$. The measuring range can be easily varied by $R_m$. On the other hand, an unfavorable factor is the incorporation of the amplifier in the measuring circuit. Its properties substantially affect the precision that can be achieved. For instance, the input resistance must be sufficiently high to keep the load on the transducer bridge A negligibly low. Moreover, the output resistance and the amplification must not be liable to drift. The only remedy is a high degree of feedback in the amplifier. Under the most unfavorable circumstances, the output voltage will then be determined only by the quality of the feedback network. This therefore also determines the precision that can be achieved, besides the resistors $R_m$ and $R_k$. Another drawback, particularly when the signals are very weak is the background noise of the measuring amplifier which is superimposed on the measuring signal.

SUMMARY OF THE INVENTION

According to the invention, these drawbacks are avoided by compensating the output voltage $V_b$ of the Wheatstone bridge A including the transducer and being unbalanced by the measured input quantity $x$, by a second voltage $V_d$ obtained from an ohmic potential divider comprising a balancing resistor R(y) having a conductance $y \Delta G_y$ or a resistance $y \Delta R_y$, wherein the supply voltage of the potential divider is composed of the input voltage $V_o$ feeding the bridge and the divisional voltage $V_d$ in such a way that when balance is obtained there is a linear relationship between the input quantity $x$ and the balancing quantity $y$, i.e. so that $y = \text{const.} \cdot x$.

BRIEF DESCRIPTION OF DRAWINGS

Other objects of this invention will appear in the following description and appended claims, reference being made to the accompanying drawings forming a part of the specification wherein like reference characters designate corresponding parts in the several views.

DESCRIPTION OF SPECIFIC EMBODIMENTS

Figure 1:
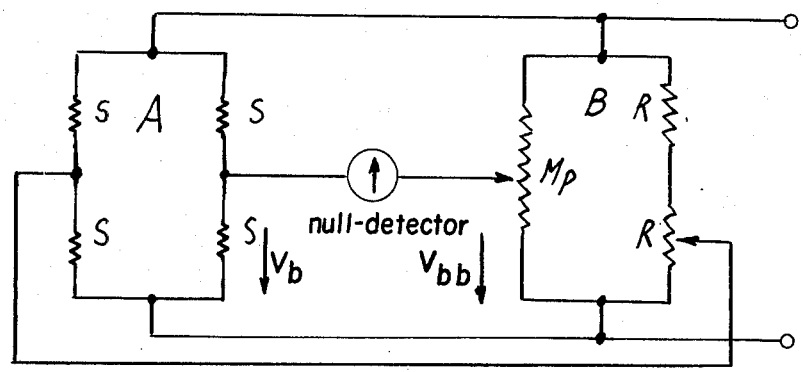
FIGS. 1–3 are schematic circuit diagrams showing prior art circuitry related to the invention.
Figure 2:
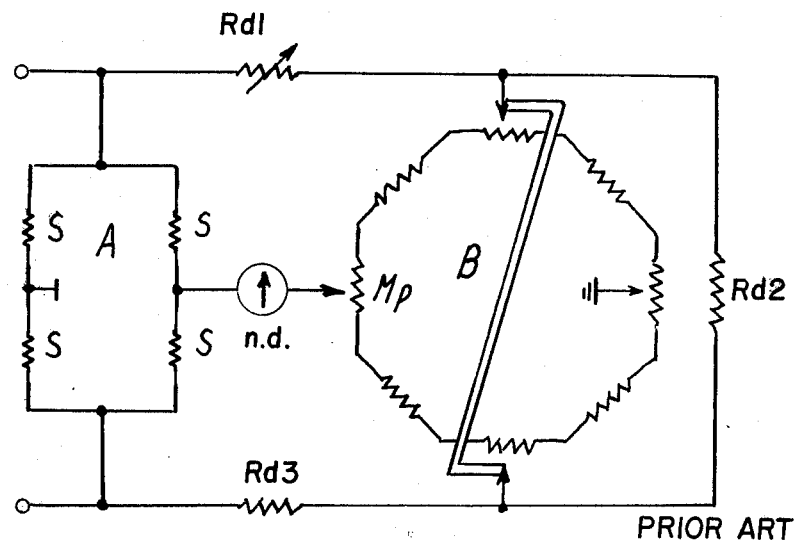
Figure 3:
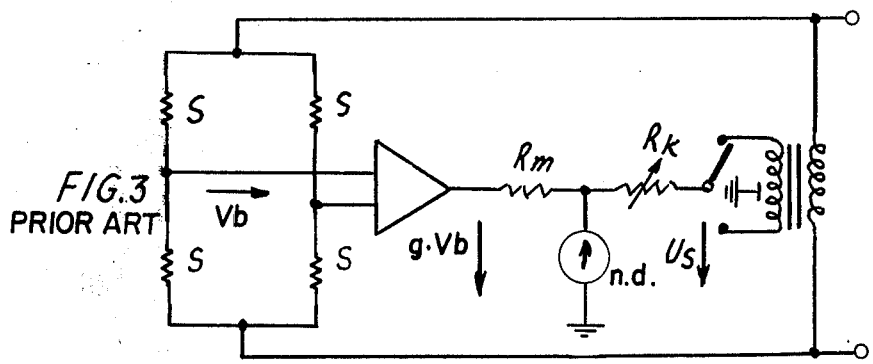

In order that the principle which underlies the invention may be better understood reference will now be made to FIG. 4. When the system is balanced, the output voltage $V_b$ of the input bridge which may first be assumed to be linearly proportional to the input quantity $x$ will be exactly compensated by a voltage $U_T$ obtained from a potential divider, and determined by the conductances $G_o$ and $y\Delta G_y$.

Introducing a transducer coefficient $a$ the following holds:

$$aV_o \cdot x = V_b \stackrel{!}{=} V_d = \frac{i}{G_o} \qquad (1)$$

The current $i$ which now flows through the divider is driven by the sum of the supply voltage $V_s$ which may differ from the bridge supply voltage $V_o$ by any factor, and the divisional voltage $V_d$ amplified by a gain factor $g$. In other words $$V_s + g \cdot V_d = i \left( \frac{1}{y\Delta G_y} + \frac{1}{G_o} \right) = i \frac{G_o + y\Delta G_y}{G_o \cdot y\Delta G_y} \qquad (2)$$

Substituting (1) in (2) results in:

$$V_s + g \cdot V_d = V_d \cdot G_o \frac{G_o + y\Delta G_y}{G_o \cdot y\Delta G_y} = V_d \cdot \frac{G_o + y\Delta G_y}{y\Delta G_y}$$

or $$V_s = V_d \left( \frac{G_o + y\Delta G_y}{y\Delta G_y} - g \right) = V_d \left( \frac{G_o + y\Delta G_y - gy\Delta G_y}{y\Delta G_y} \right)$$

or $$V_d = V_s \frac{y\Delta G_y}{G_o + y\Delta G_y(1-g)} = aV_o \cdot x \qquad (3)$$

It is apparent that for $g = 1$ equation (3) becomes $$V_d = a \cdot V_o \cdot x = \frac{V_s \Delta G_y}{G_o} \cdot y \text{ or}$$

$$x = \frac{V_s \Delta G_y}{a \cdot V_o \cdot G_o} \text{ const } y \qquad (4)$$

This means that irrespectively of the constant $a$ the input quantity $x$ will be directly indicated by the balancing quantity $y$ if $$g = 1 \text{ and } \frac{V_s \Delta G_y}{a \cdot V_o \cdot G_o} = 1 \qquad (5)$$

These conditions can be observed even if the balancing resistor has a fixed graduation $\Delta G_y$, because the choice of $V_s$ and $G_o$ still offers two degrees of freedom. Special advantages are thus obtained in connection with the rated values of the components because, given a suitable choice of $V_s$, the value of $G_o$ can be chosen from within a range that can be implemented with minimum tolerations and optimum stability. The precision of the circuit arrangement — apart from the sensitivity of the null indicating instrument — is in practice determined exclusively by the precision of the values of $G_o$ and $\Delta G_y$ because the bridge output voltage $V_b$ and the partial voltage $V_d$ will generally be much lower than the supply voltage $V_s$.

The properties of the amplifier, such as fluctuations in gain and background noise will affect the result of the measurement to a correspondingly minor degree.

In some instances the output voltage of the input bridge cannot be regarded as being linearly proportional to the quantity $x$. This will be the case for example if the input bridge contains only one resistor which changes linearly with the quantity $x$ (in a so-called quarter bridge circuit). In such a case the output voltage of the bridge, assuming a supply voltage $V_o$, will be $$V_{b1} = \frac{V_o}{2} \cdot \frac{x \cdot \frac{\Delta R_x}{R_o}}{2 + x \frac{\Delta R_x}{R_o}} = \frac{V_o}{2} \cdot \frac{ax}{2 + ax} \qquad (6)$$

The bridge transmission coefficient being assumed to be 0.5 and $\Delta R/R_o$ representing the relative change in resistance. When the system is in balance, referring to equation (3), it therefore follows that $$V_d = V_{b1} = V_s \cdot \frac{y\Delta G_y}{G_o + y\Delta G_{y(1-g)}} = \frac{V_o}{2} \cdot \frac{a \cdot x}{2 + a \cdot x} \qquad (7)$$

After rearranging the terms $$\frac{2V_s}{V_o} \cdot \frac{y\Delta G_y}{G_o + y\Delta G_{y(1-g)}} = \frac{a \cdot x}{2 + a \cdot x} \text{ or}$$

$$(2 + a \cdot x) \cdot \left( \frac{2V_s}{V_o} \cdot \frac{y\Delta G_y}{G_o + y\Delta G_{y(1-g)}} \right) = a \cdot x$$

The solution for $x$ yields $$x = \frac{2}{a} \cdot \frac{2 \cdot V_s \cdot y\Delta G_y}{V_oG_o + y\Delta G_y \cdot (V_o (1-g) - 2V_s)} \qquad (8)$$

It will be seen that a linear relationship between the value $x$ and the balancing quantity $y$ will exist if $$V_o(1-g) - 2V_s = 0 \text{ or if}$$
$$= 1 - 2\frac{V_s}{V_o} \qquad (9)$$

It therefore transpires that irrespectively of the voltage $V_S$ feeding the potentiometer, the amplification can be so adjusted that there is in fact a linear relationship between the measured quantity and the indicated quantity. Conversely, some non-linearity of the transducer can be compensated. This is an arrangement which may be desirable for instance in a temperature measuring bridge which contains a platinum resistance type temperature feeler having a non-linear temperature-resistance function.

Figure 4:
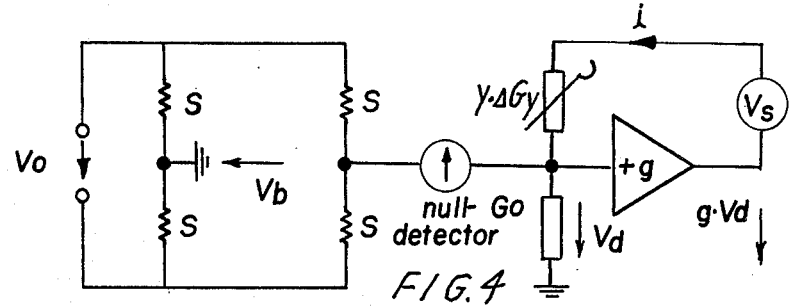
FIG. 4 is a simplified circuit diagram showing a first embodiment of the circuitry in accordance with this invention.
Figure 5:
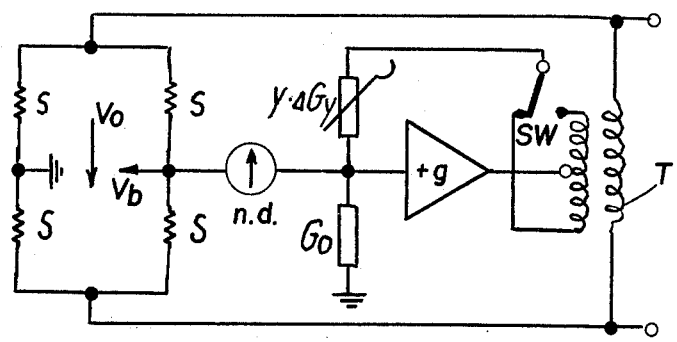
FIG. 5 is a schematic circuit diagram of an embodiment of circuitry used for an A.C. power supply.

An embodiment of the circuit corresponding to the invention as described with respect to FIG. 4, is shown in FIG. 5. The circuit as shown contains the receiving bridge which is fed with a voltage of $V_o$ and produces a condition dependent output voltage $V_b$. Furthermore and exactly as in FIG. 4, the circuit contains a zero detector and a potential divider with the conductive values $G_o$ and $y \cdot \Delta G_y$ as well as the amplifier A with the amplification $+g$.

The voltage source is shown in FIG. 5 and is realized with a transformer T which is connected with the supply voltage source $V_o$ of the receiver bridge. With the help of the reverse polarity switch SW, the voltage supply for the potential divider can be reversed in its polarity. As a result of that, both positive as well as negative output voltages of the receiver bridge can be made over into zero. Thus, respective positive and negative measuring values can be determined. As it is evident from the drawings the circuit shown in FIG. 5 is intended only for AC current use because of the transformer used.

Figure 6:
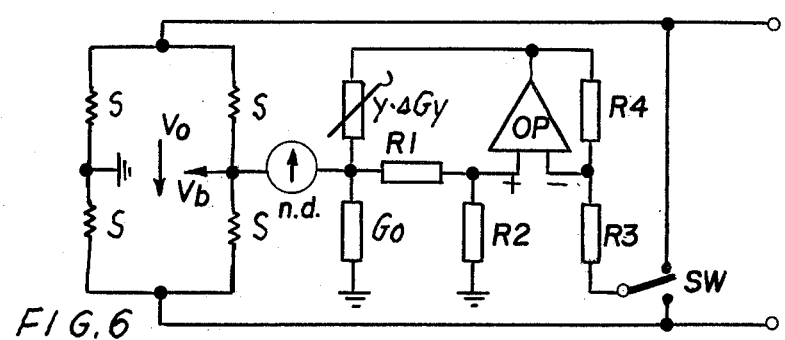
FIG. 6 is a further circuit diagram showing an embodiment of the circuitry of this invention useful with a D.C. power supply.

Another embodiment is shown in FIG. 6 wherein the voltage supply for the potential divider required corresponds to the explanations to FIG. 4. In this embodiment, an operational amplifier is used as shown. The circuit contains the receiver bridge fed with the voltage $V_o$, the zero detector, the potential divider with the conductances $G_o$ and $y \cdot \Delta G_y$ and the change over switch SW for changing over the meter. The voltage source for the supply of the potential divider is realized with an operational amplifier OP wired in a known manner with the resistors $R_1$, $R_2$, $R_3$, $R_4$. The circuit sketched in FIG. 6, of which still other variations are possible, clearly may be operated with AC or DC voltage as shown.

The invention may be embodied in other specific forms without departing from the spirit or essential characteristics thereof. The embodiments are therefore to be considered in all respects as illustrative and not restrictive.

What is claimed is:
1. A compensating bridge circuit for measuring physical quantities comprising:
    a. an unbalanced Wheatstone bridge having a quantity-dependent voltage at an output thereof,
    b. an ohmic potential divider means which produces a divisional voltage for compensating said quantity-dependent voltage,
    c. said divider means including two resistant means one of which is variable,
    d. means feeding an input voltage to the Wheatstone bridge, and
    e. means providing a supply voltage to the potential divider means,
    f. said supply voltage being composed of said bridge input voltage and said divisional voltage whereby, when the circuit system is balanced, the relationship between an input quantity x and a balancing quantity y is linear.
2. A circuit as defined in claim 1 wherein
said variable resistance means comprises an adjustable resistance $R_o$ having a variable resistance $y \Delta R_y$ with a linear scale $\Delta R_y$ to obtain a direct reading of said quantity-dependent voltage.
3. A circuit as defined in claim 1 wherein
said variable resistance means comprises an adjustable conductance $G_o$ having a variable conductance $y \cdot \Delta G_y$ with a linear scale $\Delta G_y$ to obtain a direct reading of said quantity-dependent voltage.
4. A circuit as defined in claim 1 wherein
said Wheatstone bridge includes measured quantity responsive impedances in one or more limbs thereof to produce said quantity-dependent output voltage,
a null-detector connected between a first terminal of the Wheatstone bridge and a tap terminal of the divider means.
5. A circuit as defined in claim 4 wherein
current source means supplies the Wheatstone bridge at second and third diametrically opposed terminals of the Wheatstone bridge.
6. A circuit as defined in claim 5 wherein
one end of the potential divider means includes the tap terminal thereof and the other end of the potential divider means is connected to the Wheatstone bridge.
7. An electrical bridge circuit for obtaining a direct reading of a physical quantity, said circuit comprising:
    a. an unbalanced Wheatstone bridge including measured quantity-responsive impedances in one or more branches thereof to produce a measured quantity-dependent output voltage,
    b. a voltage divider means including two resistance means one of which is variable and has a linear scale to obtain a direct reading of the measured quantity by a manipulated variable y,
    c. a null-detector connected between a first output terminal of the Wheatstone bridge and a tap terminal located at one end of the voltage divider means,
    d. means supplying a first current source at diametrically opposed terminals of the Wheatstone bridge other than said first output terminal to produce an input voltage therein, and
    e. means supplying a second current source producing a further voltage being the sum of a proportion of said Wheatstone bridge input voltage and a proportion of a voltage drop across said variable resistance means.
8. A circuit as defined in claim 7 wherein
connections from said second current source supply said voltage divider means on its end terminals.
9. A circuit as defined in claim 7 including
means for inverting the voltage of said second current source to achieve a positive and a negative measuring range.
10. A circuit as defined in claim 7 wherein
said second current source supplying means comprises an operational amplifier.
11. A circuit as defined in claim 7 wherein
said second current source supplying means comprises an operational amplifier and a transformer.
12. A circuit as defined in claim 7 wherein
said variable resistance means comprises an adjustable resistance $R_o$ having a variable resistance $y \Delta R_y$ with a linear scale $\Delta R_y$ to obtain a direct reading of said quantity-dependent voltage.
13. A circuit as defined in claim 7 wherein
said variable resistance means comprises an adjustable conductance $G_o$ having a variable conduc- tance $y \Delta G_y$ with a linear scale $\Delta G_y$ to obtain a direct reading of said quantity-dependent voltage.

14. A circuit as defined in claim 7 wherein the fourth terminal of the Wheatstone bridge is connected to ground and the voltage divider means includes a terminal connected to ground.

15. A circuit as defined in claim 14 wherein said tap terminal is located between the variable resistance means and a fixed resistance means which is connected to the ground terminal of the voltage divider means.

* * * * *